(12) United States Patent
Morita

(10) Patent No.: US 10,305,475 B2
(45) Date of Patent: May 28, 2019

(54) CAPACITANCE TOUCH SWITCH

(71) Applicant: DENSO WAVE INCORPORATED, Chita-gun, Aichi-pref. (JP)

(72) Inventor: Yuya Morita, Chita-gun (JP)

(73) Assignee: DENSO WAVE INCORPORATED, Aichi-pref. (JP)

( * ) Notice: Subject to any disclaimer, the term of this patent is extended or adjusted under 35 U.S.C. 154(b) by 111 days.

(21) Appl. No.: 15/662,491

(22) Filed: Jul. 28, 2017

(65) Prior Publication Data

US 2018/0091146 A1 Mar. 29, 2018

(30) Foreign Application Priority Data

Sep. 27, 2016 (JP) .................................. 2016-187697

(51) Int. Cl.
*G06F 3/041* (2006.01)
*H03K 17/96* (2006.01)
*G06F 3/044* (2006.01)
*G06F 1/16* (2006.01)

(52) U.S. Cl.
CPC ......... *H03K 17/9622* (2013.01); *G06F 3/044* (2013.01); *G06F 3/0412* (2013.01); *H03K 17/962* (2013.01); *G06F 1/16* (2013.01); *H03K 2017/9602* (2013.01); *H03K 2217/960755* (2013.01); *H03K 2217/960765* (2013.01)

(58) Field of Classification Search
CPC ............. H03K 17/9622; H03K 17/962; H03K 2217/960765; H03K 2017/9602; H03K 2217/960755; G06F 3/044; G06F 3/0412; G06F 1/16; G06F 3/041; G06F 2203/04101; G06F 2203/04107

See application file for complete search history.

(56) References Cited

U.S. PATENT DOCUMENTS

| 2012/0268418 | A1* | 10/2012 | Ishizaki | G06F 3/0412 345/174 |
| 2014/0293163 | A1* | 10/2014 | Ju | G06F 3/044 349/12 |
| 2017/0147104 | A1* | 5/2017 | Imazeki | G06F 3/044 |

FOREIGN PATENT DOCUMENTS

JP 2012-79661 A 4/2012

* cited by examiner

*Primary Examiner* — Adam R. Giesy
(74) *Attorney, Agent, or Firm* — Oliff PLC

(57) ABSTRACT

A capacitance touch switch includes a touch electrode being flat and having a length longer in a first direction than a length in a second direction perpendicular to the first direction, a touch detection circuit which determines whether a touch operation is performed to the touch electrode based on a change in capacitance of the touch electrode, and a guard electrode insulated from the touch electrode. The touch electrode includes at least one slit extending in a direction which is angled at a larger angle with respect to the first direction than an angle from the second direction. The touch electrode is partially separated by the at least one slit into a plurality of touch regions while the plurality of touch regions being connected to each other. The guard electrode is disposed within the slit.

6 Claims, 9 Drawing Sheets

CAPACITANCE TOUCH SWITCH

CROSS REFERENCE TO RELATED APPLICATION

This application is based on and incorporates herein by reference Japanese Patent Application No. 2016-187697 filed on Sep. 27, 2016.

TECHNICAL FIELD

The present disclosure relates to a capacitance touch switch for a controller.

BACKGROUND

Patent Document 1 (JP 2012-079661 A) discloses a capacitance touch switch. The touch switch includes a touch detection electrode (touch electrode) having a capacitance which varies due to a touch operation by an operator, and a detector which applies an alternating-current voltage to the touch detection electrode and detects the variation of the capacitance caused by the touch operation. The touch detection electrode is made from a copper foil and has a circular shape on a circuit board. The detector detects the touch operation by detecting the variation of the capacitance.

SUMMARY

A touch electrode generally has an approximately up-down and left-right symmetric shape, such as a circular shape or a square shape. For example, FIG. 15 shows a change in sensitivity during a finger moving away from a square touch electrode. The "sensitivity" in the present disclosure means a responsiveness of the touch electrode to a finger operation by an operator. The "responsiveness of the touch electrode" means a voltage value of a signal corresponding to a capacitance of the touch electrode. An OFF threshold of the sensitivity is an upper limit below which a touch operation to the touch electrode is determined not to be performed. When the finger of the operator moves away from the square touch electrode after contacting a center of the square touch electrode, the sensitivity of the square touch electrode sharply decreases as shown in FIG. 15. In a range larger than a distance D1 between the finger and the touch electrode, the touch operation to the square touch electrode is determined not to be performed.

On the other hand, FIG. 16 shows a change in sensitivity of a rectangular touch electrode, for example. When a finger of an operator moves away from the rectangular touch electrode, the decrease in sensitivity of the rectangular touch electrode is slower than the decrease in sensitivity shown in FIG. 15. Therefore, the touch operation to the touch electrode is determined to be performed until the distance between the finger and the rectangular touch electrode reaches a distance D2 which is larger than the distance D1 shown in FIG. 15. Hence, in the case where the touch electrode has the rectangular shape, feelings of slow response and discomfort may be given to the operator when the finger moving away from the touch electrode. A touched state where the touch operation is determined to be performed is detected during a predetermined interval from a separation of the finger of the operator from the touch electrode. In other words, a difference between an operation expected by the operator (i.e. stop touching) and an actual operation executed by the touch electrode (i.e. continue touching) may reach a recognizable level for the operator. This phenomenon is observed not only in the rectangular-shaped touch electrode but in another-shaped electrode elongated in its longitudinal direction.

However, when the touch electrode is actually commercialized, the touch electrode elongated in the longitudinal direction may be useful in order to fit to a shape of a controller of an air conditioner, for example.

It is an objective of the present disclosure to provide a capacitance touch switch including an elongated touch electrode in which a response in a transition from a touched state to a non-touched state is accelerated.

According to an aspect of the present disclosure, a capacitance touch switch includes a touch electrode, a touch detection circuit and a guard electrode. The touch electrode is flat and has a first length along a first direction and a second length along a second direction. The first length is longer than the second length, and the first direction is perpendicular to the second direction. The touch detection circuit is configured to determine whether a touch operation to the touch electrode is performed based on a change in capacitance of the touch electrode. The guard electrode is insulated from the touch electrode. The touch electrode includes at least one slit extending in a direction which is angled at a first angle with respect to the first direction and angled at a second angle with respect to the second direction. The first angle is larger than the second angle. The touch electrode is partially separated by the at least one slit into a plurality of touch regions while the plurality of touch regions being connected to each other. The guard electrode is disposed within the slit.

According to the above-described capacitance touch switch, the touch electrode is divided by the slit and the guard electrode into the multiple touch regions having shapes close to squares. Hence, a response of the touch electrode in transition from a touched state to a non-touched state during the touch operation can be accelerated. Further, the capacitance touch switch includes the approximately square multiple touch regions which are connected to each other. Therefore, with respect to wiring connection, wiring can be simplified and burden of designing can be reduced, as compared to a case where multiple square touch electrodes are arranged and separately connected by wiring.

The present disclosure can be achieved by various aspects other than the above-described aspect. For example, the present disclosure can be achieved by a manufacturing method for the capacitance touch switch, a capacitance touch electrode, and a manufacturing method for the capacitance touch electrode.

BRIEF DESCRIPTION OF THE DRAWINGS

The disclosure, together with additional objectives, features and advantages thereof, will be best understood from the following description, the appended claims and the accompanying drawings, in which:

DETAILED DESCRIPTION

Figure 1:
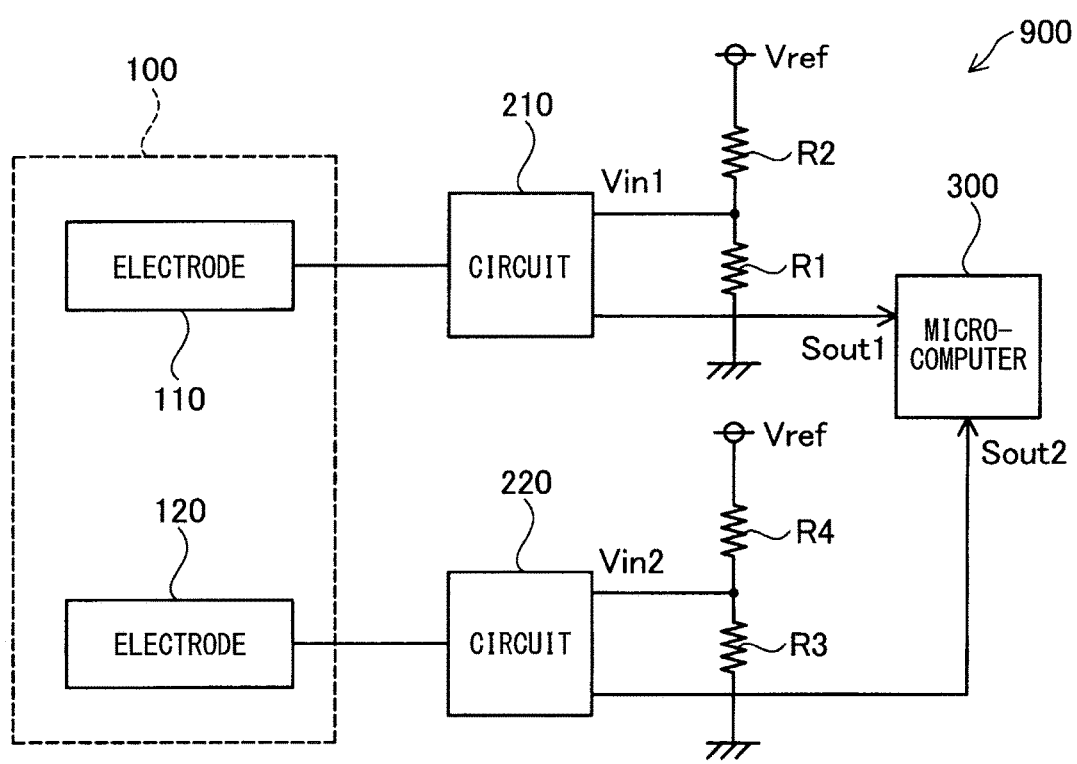
FIG. 1 is a diagram illustrating a system configuration of a capacitance touch switch according to a first embodiment of the present disclosure.

Embodiments of the present disclosure will be described hereinafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

FIG. 1 shows a system configuration of a capacitance touch switch 900 of a first embodiment of the present disclosure. The capacitance touch switch 900 is used for a controller of an air conditioner, for example. The capacitance touch switch 900 includes a touch panel 100 having a pair of touch electrodes 110 and 120, a pair of touch detection circuits 210 and 220, resistors R1, R2, R3 and R4, and a microcomputer 300. The touch electrode 110 is connected to the touch detection circuit 210, and the touch electrode 120 is connected to the touch detection circuit 220. A reference voltage Vref is divided by the resistors R1 and R2 into a voltage Vin1 to be inputted to the touch detection circuit 210. A reference voltage Vref is divided by the resistors R3 and R4 into a voltage Vin2 to be inputted to the touch detection circuit 220. These voltages Vin1 and Vin2 are used for adjustment of thresholds of the touch detection circuits 210 and 220. The microcomputer 300 includes a central processing unit and a main storage unit.

When an operator (e.g. human) performs a touch operation to the touch panel 100, a change in capacitance occurs in the touch electrodes 110 and 120. The touch detection circuits 210 and 220 generate output signals Sout1 and Sout2, respectively, depending on the change in capacitance occurred in the touch electrodes 110 and 120. The output signals Sout1 and Sout2 indicate whether the touch operation has been performed. The touch detection circuits 210 and 220 outputs the output signals Sout1 and Sout2 to the microcomputer 300. The microcomputer 300 determines whether the touch operation to the touch electrodes 110 and 120 by the operator has been performed based on the signals Sout1 and Sout2.

Figure 2:
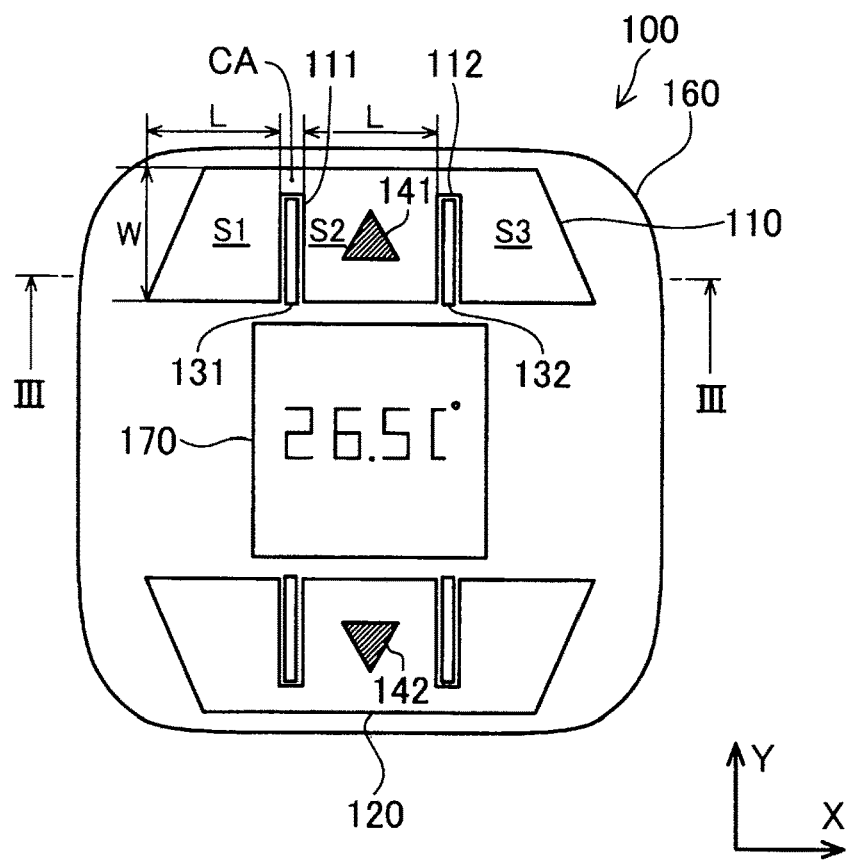
FIG. 2 is a top view illustrating a touch panel.

FIG. 2 is a top view of the touch panel 100. In FIG. 2, an X direction and a Y direction are perpendicular to each other. The touch panel 100 includes a substrate 160 provided with the touch electrodes 110 and 120, and a display 170. The display 170 is a visual display device such as a liquid crystal display and shows a preset temperature of an air conditioner. Temperature adjustment marks 141 and 142 representing increase and decrease in preset temperature are drawn on the touch electrodes 110 and 120, respectively. At the time of adjusting temperature, the operator can change the preset temperature by touching any position within entire areas of the touch electrodes 110 and 120 including areas of the temperature adjustment marks 141 and 142.

The touch electrodes 110 and 120 are made of a conductive material, for example, cupper foil, carbon or conductive rubber. A shape of each touch electrode is flat and trapezoidal. The bases of the trapezoid may extend in a longitudinal direction (first direction), and the height of the trapezoid (i.e. distance between the bases) may be parallel to a transverse direction (second direction) that is perpendicular to the longitudinal direction. The bases of the trapezoid may be longer than the height of the trapezoid. In the drawings of the preset specification, the longitudinal direction is parallel to an X direction, and the transverse direction is parallel to a Y direction. Hereinafter, the X direction may be referred to as the longitudinal direction X, and the Y direction may be referred to as the transverse direction Y. The touch electrodes 110 and 120 are symmetric to each other with respect to a center axis which extends in the X direction of the touch panel 100. The touch electrodes 110 and 120 have the same structure. A length of longer one of the two bases of the trapezoid may be an example of a first length of a touch electrode 110 or 120, and the height of the trapezoid may be an example of a second length of the touch electrode 110 or 120. A ratio of the first length to the second length may be more than 3.0.

The touch electrode 110 includes slits 111 and 112 which extend in the transverse direction Y. The slits 111 and 112 are arranged to be next to each other in the longitudinal direction X. The slits 111 and 112 separate the touch electrode 110 into three touch regions S1, S2 and S3. The touch regions S1 and S2 are partially separated by the slit 111 while the touch regions S1 and S2 are connected to each other. The touch regions S2 and S3 are partially separated by the slit 112 while the touch regions S2 and S3 are connected to each other. Each boundary between the touch regions S1, S2 and S3 can be defined by assuming a state where the slits 111 and 112 further extend to completely separate the touch regions S1, S2 and S3. Therefore, there is a connection area CA, for example, between two touch regions S1 and S2, and the connection area does not belong to any of the touch regions S1 and S2 and has the same width as the slit 111. The slits 111 and 112 extend in a direction which is angled at approximately 90° with respect to the longitudinal direction X. However, the slits 111 and 112 may extend in a direction which is angled from 80° to 90° with respect to the longitudinal direction X.

A shape of the touch region S1 of the touch electrode 110 is trapezoidal such that a circumscribed rectangle which circumscribes the trapezoid of the touch region S1 has a length L along the longitudinal direction X and a width W along the transverse direction Y while a ratio (L/W) of the length L to the width W is approximately 1. A shape of the touch region S2 is substantially square, and a circumscribed rectangle which circumscribes the square has a length L along the longitudinal direction X and a width W along the transverse direction Y. The length L of the circumscribed rectangle of the touch region S2 is equal to the length L of the circumscribed rectangle of the touch region S1. The width W of the circumscribed rectangle of the touch region S2 is equal to the width W of the circumscribed rectangle of the touch region S1. The touch region S3 has the same shape as the touch region S1. Accordingly, the ratio (L/W) of the length L to the width W is approximately 1 in each circumscribed rectangle of the touch regions S1, S2 and S3. The circumscribed rectangles define sizes of the respective touch regions S1, S2 and S3. Four sides of each circumscribed rectangle are in contact with the touch region S1, S2 and S3. Each circumscribed rectangle is defined as a smallest rectangle which circumscribes the touch region S1, S2 and S3 and has a side parallel to the longitudinal direction X of the touch electrode 100, and a side parallel to the transverse direction Y.

Guard electrodes 131 and 132 are disposed within the slits 111 and 112, respectively. The guard electrodes 131 and 132 are insulated from the touch electrode 110. Sizes of the silts 111 and 112 measured along the transverse direction Y of the touch electrode 110 may be more than or equal to 80% and less than 100% of the width W of the touch electrode 110 in the transverse direction Y. In other words, sizes of the connection areas CA measured along the transverse direction Y of the touch electrode 110 may be less than 20% of the width W of the touch electrode 110 in the transverse direction Y. Similarly, sizes of the guard electrodes 131 and 132 measured along the transverse direction Y of the touch electrode 110 may be more than or equal to 80% and less than 100% of the width W of the touch electrode 110 in the transverse direction Y. Therefore, the multiple touch regions S1, S2 and S3 can be electrically and certainly separated from each other.

Figure 3:
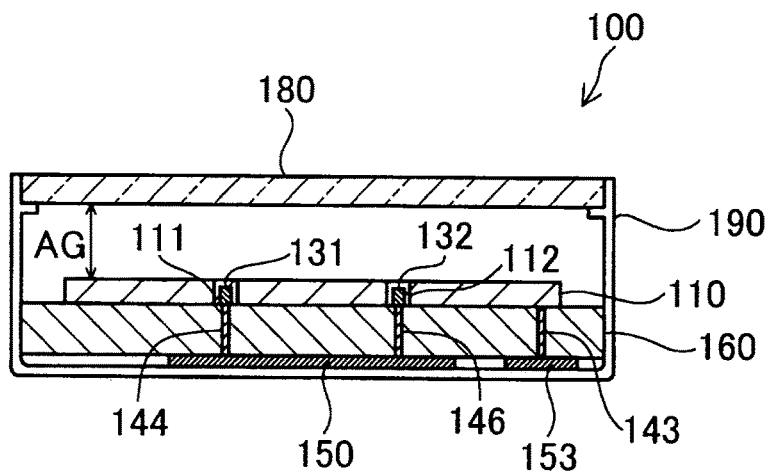
FIG. 3 is a cross-sectional view illustrating the touch panel.

FIG. 3 illustrates a cross-sectional surface of the touch panel 100 taken along a line III-III of FIG. 2. In FIG. 3, a panel casing 190 is depicted and houses components of the touch panel 100. A glass 180 is disposed on an upper side of the panel casing 190. An air gap AG is present between the glass 180 and the touch electrode 110. A ground pattern 150 and a wiring connection pattern 153 are provided on a surface of the substrate 160 on an opposite side from the touch electrode 110. The guard electrodes 131 and 132 are connected to the ground pattern 150 through through-holes 144 and 146 provided in the substrate 160. The ground pattern 150 may be substantially grounded by connection to a lager metallic component. The ground pattern 150 may be substantially ungrounded. The guard electrodes 131 and 132 may be connected to a ground electrode (not shown) instead of being connected to the ground pattern 150. The touch electrode 110 is connected to the wiring connection pattern 153 through a through-hole 143 provided in the substrate 160. The touch electrode 110 is connected to the touch detection circuit 210 shown in FIG. 1 through the wiring connection pattern 153.

Figure 4:
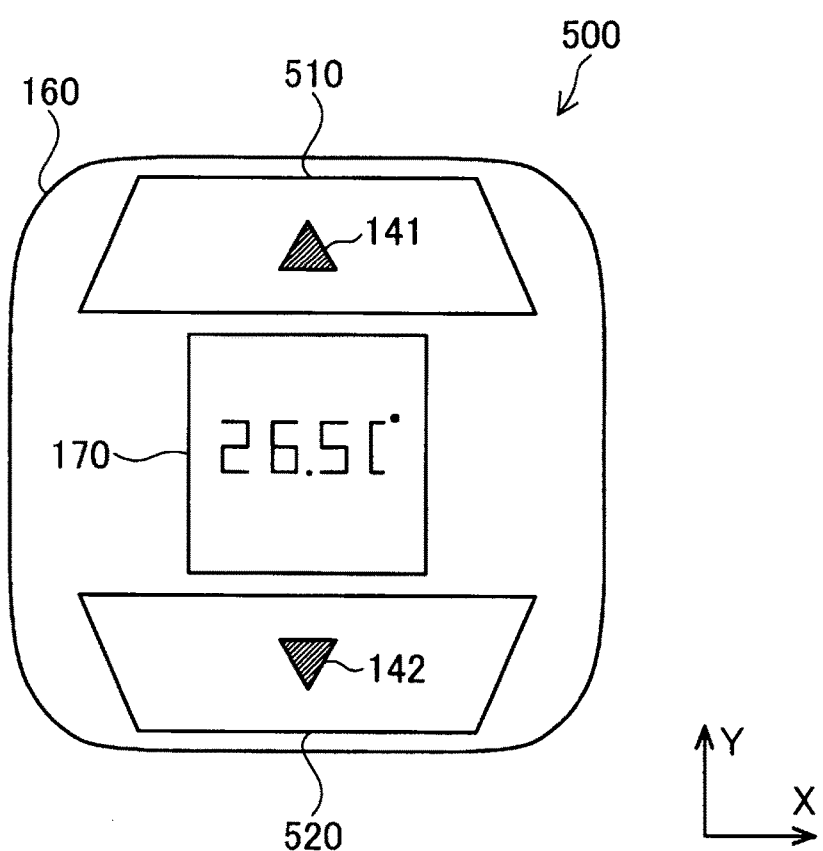
FIG. 4 is a top view illustrating a touch panel according to a comparative example of the present disclosure.

FIG. 4 is a top view showing a touch panel 500 according to a comparative example. The comparative example is different from the first embodiment of the present disclosure shown in FIG. 2 in that touch electrodes 510 and 520 do not have slit, and no guard electrode is provided. The other configurations are the same as the first embodiment.

Figure 5:
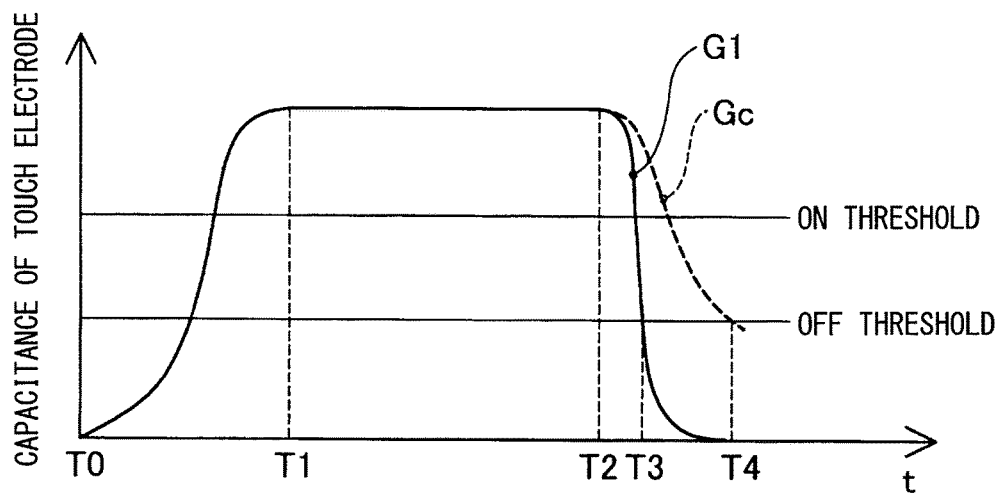
FIG. 5 is a diagram illustrating a change over time in capacitance of a touch electrode when a touch operation is performed.

FIG. 5 shows changes over time in capacitance of the touch electrodes 110 and 510 when a touch operation is performed by an operator to the touch panel 100 shown in FIG. 2 and the touch panel 500 shown in FIG. 4. A graph G1 represents a change in time in capacitance of the touch electrode 110. A graph Gc represents a change in time in capacitance of the touch electrode 510 of the comparative example. An ON threshold and an OFF threshold are reference values for determination whether the touch operation to the touch panel is performed. When the capacitance of the touch electrode becomes higher than the ON threshold, the touch operation is determined to be performed. When the capacitance of the touch electrode becomes lower than the OFF threshold, the touch operation is determined not to be performed.

During a time period between T0 and T1, a finger of the operator approaches the touch panel 100 and 500, and then the finger contacts a surface of the touch panel 100 and 500 at the time point T1. In this process, the capacitance of the touch electrode 110 and 510 increases, and then when the capacitance becoming higher than the ON threshold, the touch operation is determined to be performed. According to an experiment of the inventor, difference in shape of the touch electrode does not have a lot of influence on the change in capacitance during transition from a non-touched state to a touched state. Therefore, as shown in FIG. 5, there is little difference between the graphs G1 and Gc during the time period between T0 and T1. During a time period between T1 and T2, the finger of the operator is in contact with and stays on the surface of the touch panel 100 and 500 while the capacitance of the touch electrode 110 and 510 does not change.

At time T2, the operator starts to move the finger away from the touch panel 100 and 500, and then the capacitance of the touch electrode 110 and 510 decreases. In this process, the capacitance of the touch electrode 110 sharply decreases during a time period between T2 and T3 and becomes lower than the OFF threshold at time T3. On the other hand, the capacitance of the touch electrode 510 of the comparative example gradually decreases during a time period between T2 and T4 and becomes lower than the OFF threshold at time T4. Therefore, the touch operation to the touch panel 100 is determined to be being performed during a time period from a time of separation of the finger of the operator from the touch panel 100 to time T3. The touch operation to the touch panel 500 of the comparative example is determined to be being performed during a time period between a time of separation of the finger of the operator from the touch panel 500 and time T4. Accordingly, as compared to the touch panel 100 of the first embodiment of the present disclosure, the operator may feel slow and uncomfortable in the touch operation to the touch panel 500 of the comparative example during a time period between T3 and T4.

Figure 6:
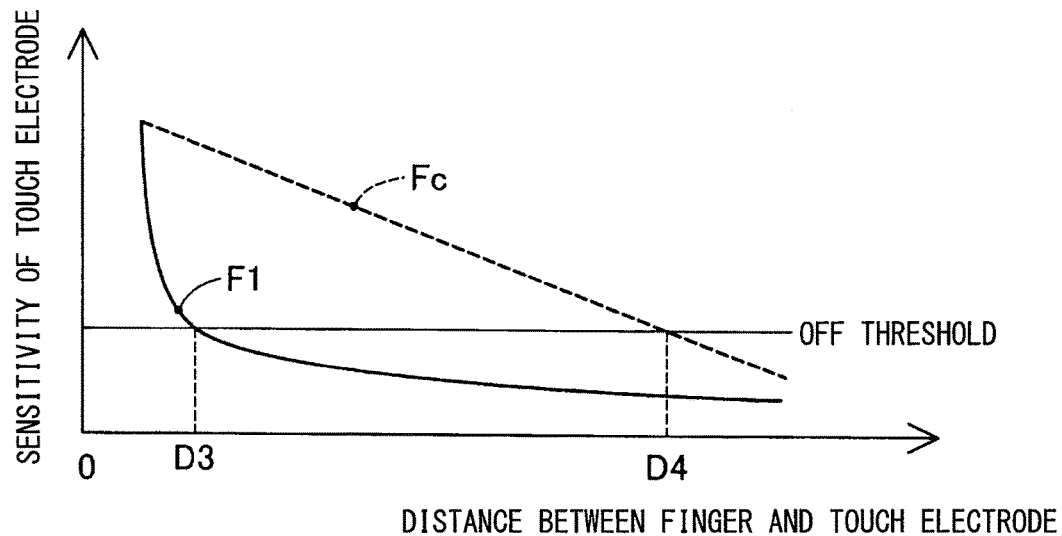
FIG. 6 is a diagram illustrating a change in sensitivity of the touch electrode when a touch operation is performed.

FIG. 6 shows a change in sensitivity of the touch electrode in the similar touch operation of FIG. 5. A graph F1 represents a relationship of the sensitivity of the touch electrode 110 shown in FIG. 2 and a distance between the finger and the touch electrode 110. A graph Fc is represents a relationship of the sensitivity of the touch electrode 510 shown in FIG. 4 and a distance between the finger and the touch electrode 510. An OFF threshold in FIG. 6 corresponds to the OFF threshold of FIG. 5. The OFF threshold in FIG. 6 is an upper limit below which the touch operation is determined not to be performed.

Figure 15:
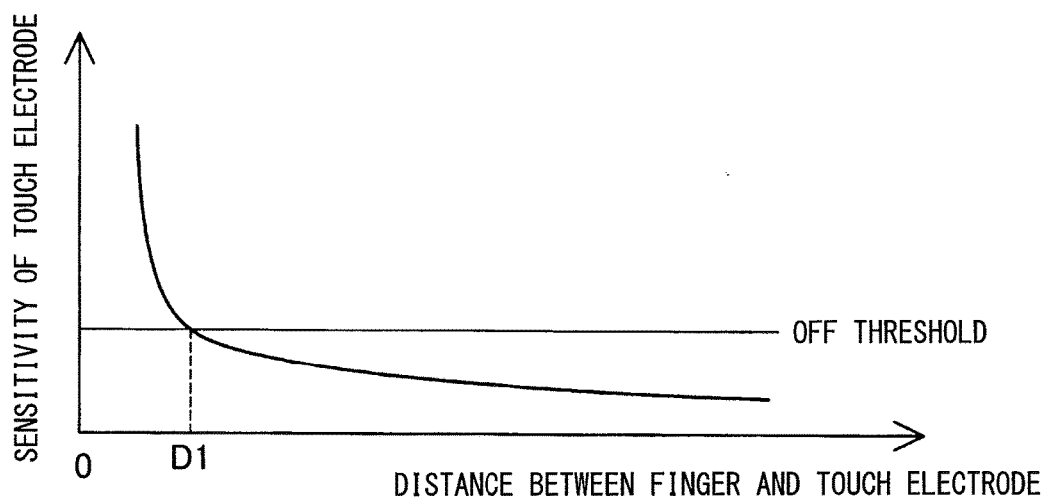
FIG. 15 is a diagram illustrating a change in sensitivity of a square touch electrode.
Figure 16:
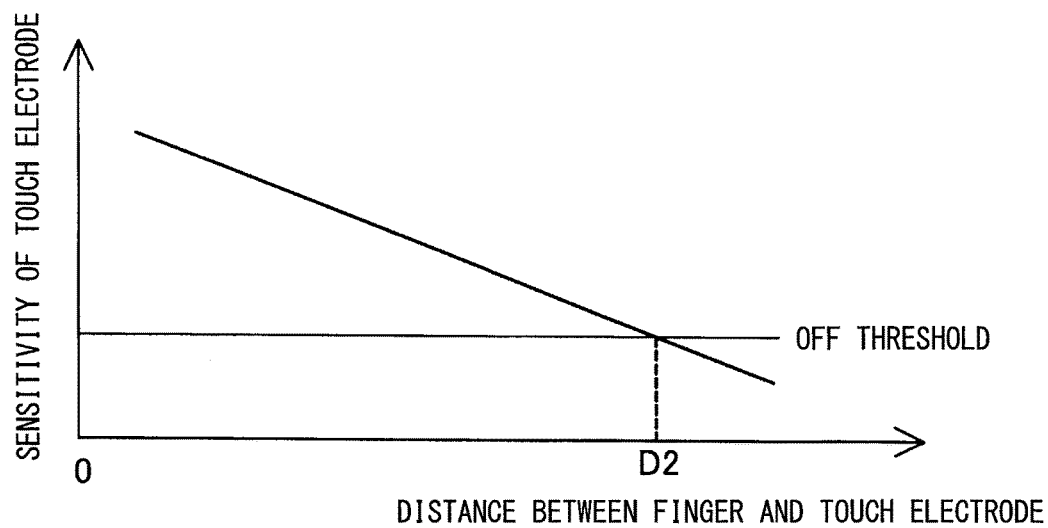
FIG. 16 is a diagram illustrating a change in sensitivity of a rectangular touch electrode.

As indicated by the graph F1, when the finger of the operator touches and moves away from the touch panel 100 shown in FIG. 2, the sensitivity of the touch electrode 110 sharply decreases, and then the touch operation is determined not to be performed at D3 or larger in distance between the finger and the touch electrode 110. On the other hand, as indicated by the graph Fc, when the finger of the operator moves away from the touch panel 500 of the comparative example shown in FIG. 4, the sensitivity of the touch electrode 510 gradually decreases, and then the touch operation is determined not to be performed at D4 or larger in distance between the finger and the touch electrode 510. In the touch operation to the touch panel 500, the touch operation is determined to be performed until the distance between the finger of the operator and the touch panel 500 becomes greater than D4 which is larger than D3. Thus, as compared to the touch operation to the touch panel 100 of the first embodiment of the present disclosure, the operator may feel slow and uncomfortable in the touch operation to the touch panel 500. The graph F1 is similar to a graph of FIG. 15 that indicates change in sensitivity of a square touch electrode when a touch operation to the square touch electrode is performed. The graph Fc is similar to a graph of FIG. 16 that indicates change in sensitivity of a rectangular touch electrode when a touch operation to the rectangular touch electrode is performed.

The touch electrode 110 having a shape close to rectangular, shown in FIG. 2, is divided into the touch regions S1, S2 and S3 having shapes close to squares by the slits 111 and 112 and the guard electrodes 131 and 132. Therefore, as shown in FIG. 6, giving the slow and uncomfortable feeling of the operator during the touch operation can be reduced. With respect to each touch region S1, S2 and S3, the ratio (L/W) of the length L of the circumscribed rectangle in the longitudinal direction to the width W of the circumscribed rectangle in the transverse direction is approximately 1. In other words, each touch region S1, S2 and S3 has a shape much closer to square. Hence, giving the slow and uncomfortable feeling of the operator during the touch operation can be further reduced. These effects can be obtained also in the touch electrode 120. The dimensional ratio L/W of each touch region S1, S2 and S3 may be set in a range from 0.7 to 1.3. Accordingly, each touch region S1, S2 and S3 has a shape much closer to square. Therefore, a responsiveness of the touch electrode 110 to change from a touched state to a non-touched state can be improved.

Figure 7:
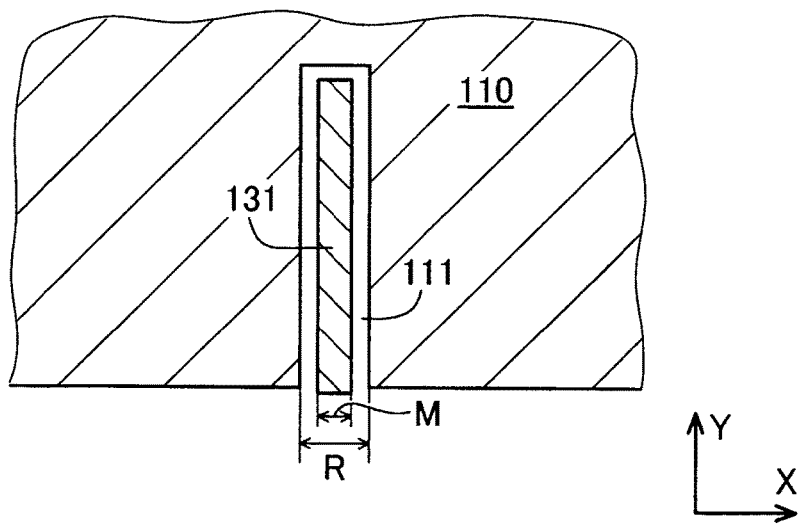
FIG. 7 is a diagram illustrating a slit portion of the touch electrode.

FIG. 7 shows the slit 111 of the touch electrode 110. The slit 111 has a width R in the X direction. The guard electrode 131 has a width M in the X direction. Similarly, the slit 112 shown in FIG. 2 has a width R in the X direction. The guard electrode 132 shown in FIG. 2 has a width M in the X direction.

Figure 8:
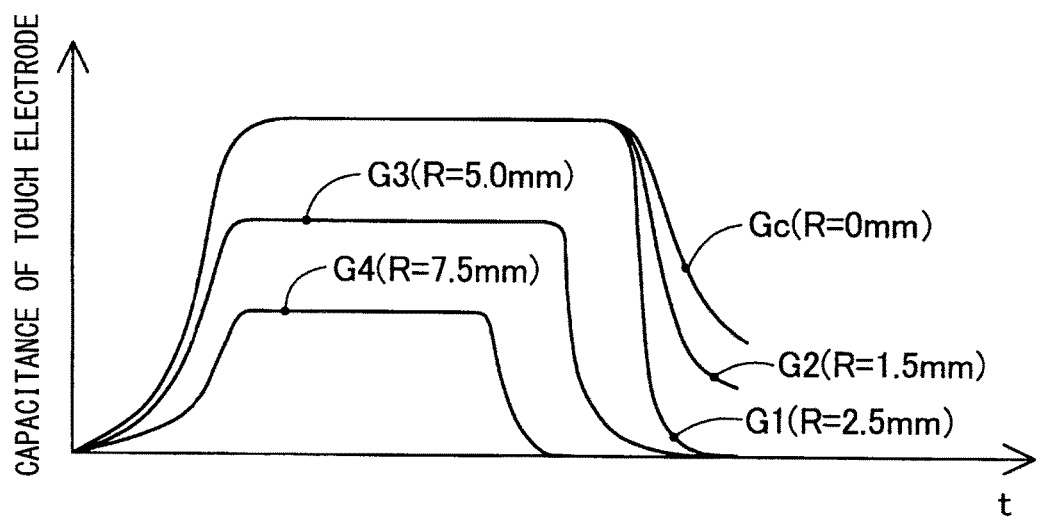
FIG. 8 is a diagram illustrating a change over time in capacitance of a touch electrode including a slit portion having a different width.

FIG. 8 shows change over time in capacitance of the touch electrode 110 when the touch operation to the touch panel 100 shown in FIG. 2. The width M of the guard electrodes 131 and 132 shown in FIG. 7 is set at a constant value (1 mm), and the width R of the touch electrode 110 shown in FIG. 7 is changed in a range from 1.5 mm to 7.5 mm. A graph Gc in FIG. 8 is the same as the graph Gc of FIG. 5 and indicates change over time in capacitance of the touch electrode 510 of FIG. 4 in which no slit is provided. A graph G1 in FIG. 8 is the same as the graph G1 of FIG. 5 of the first embodiment and indicates change over time in capacitance of the touch electrode 110 in which slits 111 and 112 having the width R of 2.5 mm are provided. Graphs G2, G3 and G4 are experimental examples where the width R of the slits 111 and 112 are different. According to the graphs Gc, G1 to G4, the capacitance of the touch electrode rises as the finger of the operator approaches the touch panel 100 or 500, keeps constant when the finger stays on the touch panel 100 or 500, and declines as the finger moves away from the touch panel 100 or 500.

When the width R of the slits 111 and 112 of the touch electrode 110 is 2.5 mm (Graph G1), the operator may not feel slow and uncomfortable because the decrease in capacitance of the touch electrode 110 at the time of the finger moving away is quite sharp as compared to the other values in width R. When the width R of the slits 111 and 112 is 2.5 mm (Graph G1), a difference in capacitance of the touch electrode 110 between the touched state and the non-touched state is large as compared to the width R of 5.0 mm (Graph G3) and 7.5 mm (Graph G4). Hence, a range between the ON threshold and the OFF threshold shown in FIG. 5 can be widened. Therefore, the width R of each slit 111 and 112 of the touch electrode 110 may be set larger than or equal to 2.0 mm and smaller than or equal to 3.0 mm.

When the guard electrodes 131 and 132 are connected to the ground pattern 150 or the ground electrode, influence by the touch regions S1, S2 and S3 on each other caused by electrical change generated in the touch electrode 110 at a time of touching can be reduced. Therefore, the touch regions S1, S2 and S3 can be electrically separated from each other certainly. The width R of each slit 111 and 112 can be shortened, and areas of the touch regions S1, S2 and S3 can be increased. Consequently, a response of the touch electrode at the time of the finger of the operator contacting the touch electrode 110 can be accelerated.

As described above, in the first embodiment, the touch electrode 110 having the longitudinal direction X and the transverse direction Y is separated into the touch regions S1, S2 and S3 by the slits 111 and 112 and the guard electrodes 131 and 132. Thus, the response of the touch electrode 110 in transition from the touched state to the non-touched state during the touch operation can be accelerated. Further, the touch regions S1, S2 and S3 of the touch electrode 110 having shapes close to squares are connected to each other. Thus, with respect to wiring connection, a wiring process can be simplified and a burden of designing can be reduced, as compared with a case where multiple square touch electrodes are arranged and separately connected by wiring.

FIGS. 9 to 14 show top views of the touch panel 100 in other embodiments and correspond to FIG. 2. A difference from the first embodiment shown in FIG. 2 is the shape of each touch electrode 110 and 120. The other configurations are similar to the first embodiment. In FIGS. 9 to 14, a longest length of each touch electrode 110 and 120 in the longitudinal direction X may be used as an example of the first length of the touch electrode, and the width of each touch electrode 110 and 120 in the transverse direction Y may be used as an example of the second length of the touch electrode. A ratio of the first length to the second length may be more than 3.0.

Figure 9:
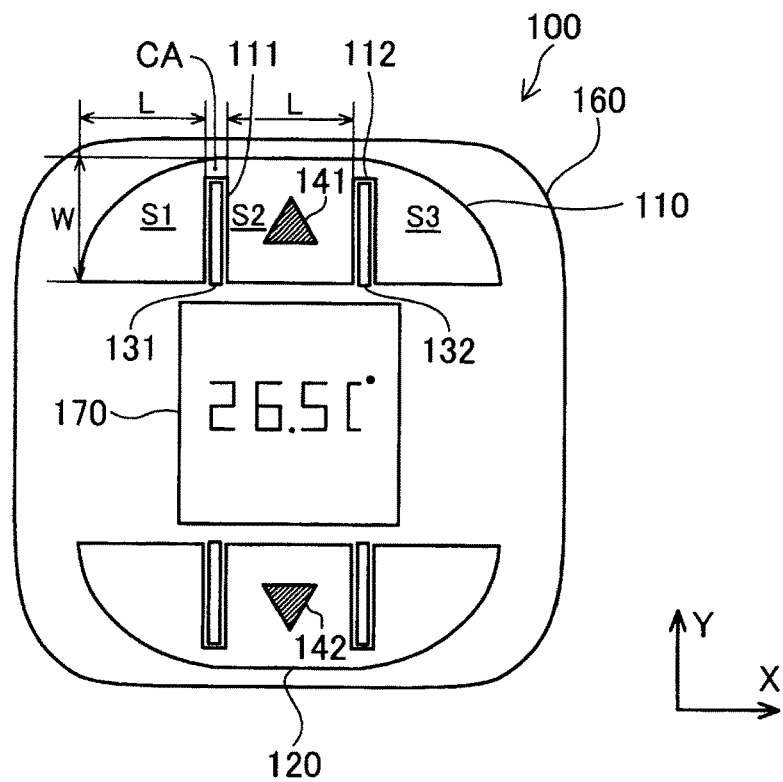
FIG. 9 is a top view illustrating a touch panel according to another embodiment.
Figure 10:
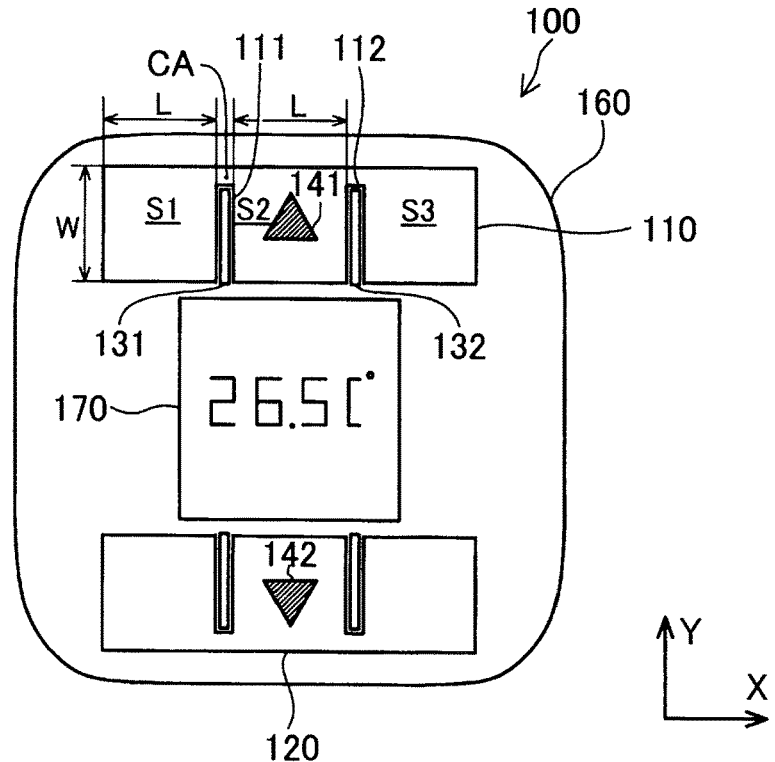
FIG. 10 is a top view illustrating a touch panel according to another embodiment.
Figure 11:
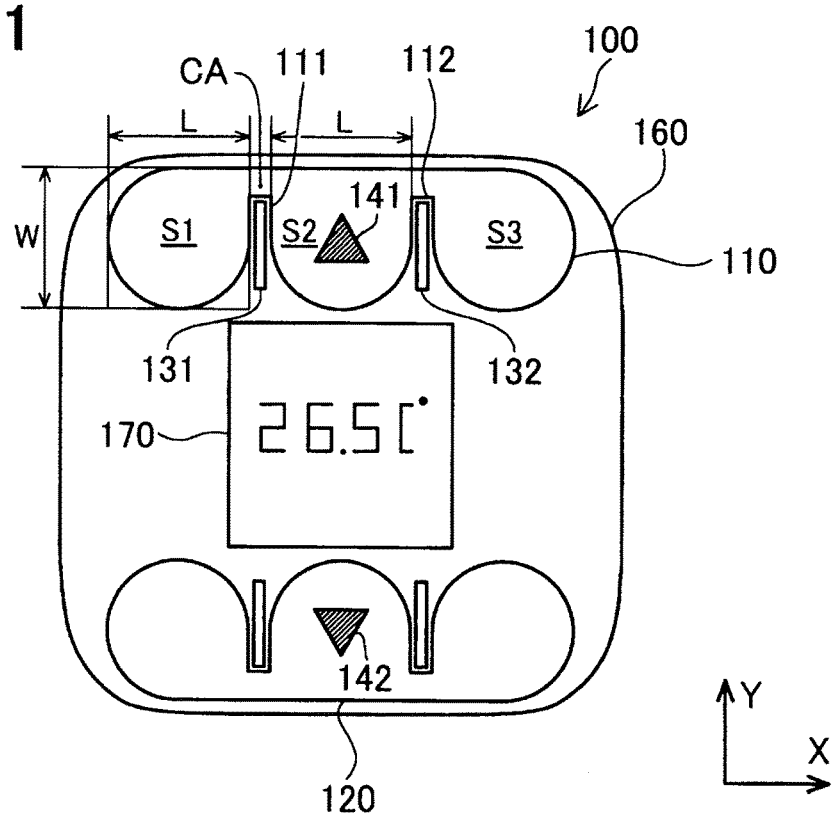
FIG. 11 is a top view illustrating a touch panel according to another embodiment.
Figure 12:
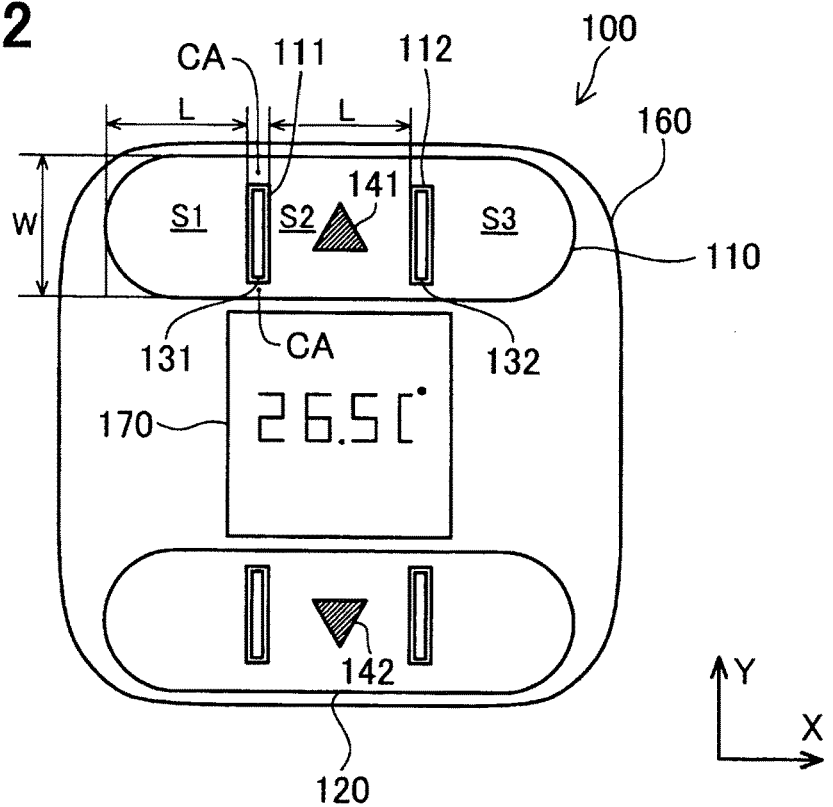
FIG. 12 is a top view illustrating a touch panel according to another embodiment.

In FIG. 9, the touch regions S1 and S3 on opposite sides of each touch electrode 110 and 120 have shapes of quarter-circles. In FIG. 10, the touch regions S1 and S3 on opposite sides of each touch electrode 110 and 120 have shapes of approximate squares similar to the center touch region S2. In FIG. 11, the touch regions S1 and S3 on opposite sides of each touch electrode 110 and 120 have shapes of approximate circles. In FIG. 12, the touch regions S1 and S3 on opposite sides of each touch electrode 110 and 120 have shapes of approximate semicircles. The slits 111 and 112 in FIG. 12 do not extend to opposite sides of the touch electrode 110, i.e. the slits 111 and 112 are openings in which both ends in the transverse direction Y are closed. In this case, sizes of connections areas CA located on both ends of each slit 111 and 112 measured along the transverse direction Y of the touch electrode 110 may be set to be less than 20% of the width W of the touch electrode 110 in the transverse direction Y.

Figure 13:
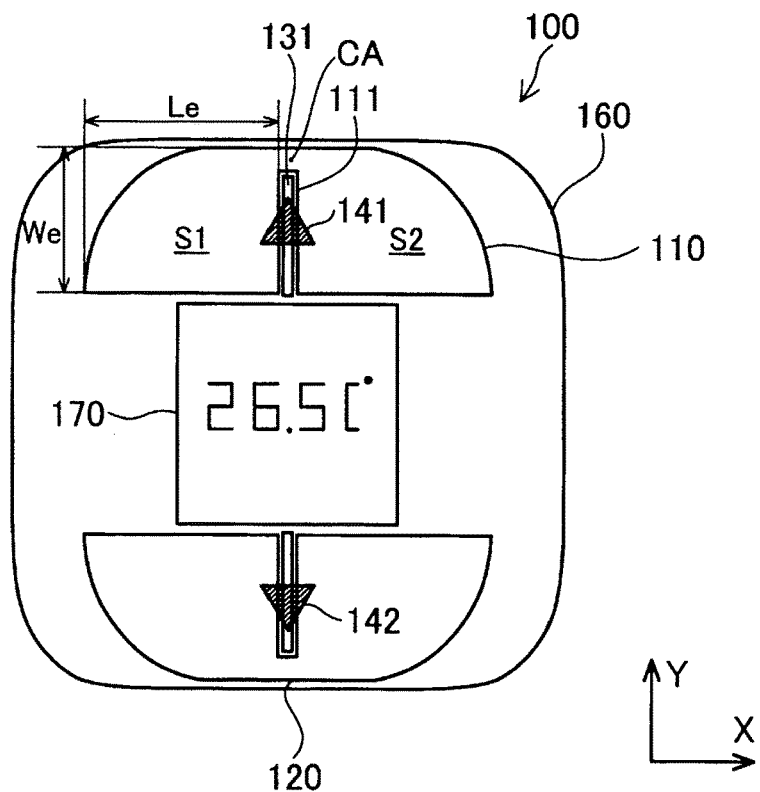
FIG. 13 is a top view illustrating a touch panel according to another embodiment.
Figure 14:
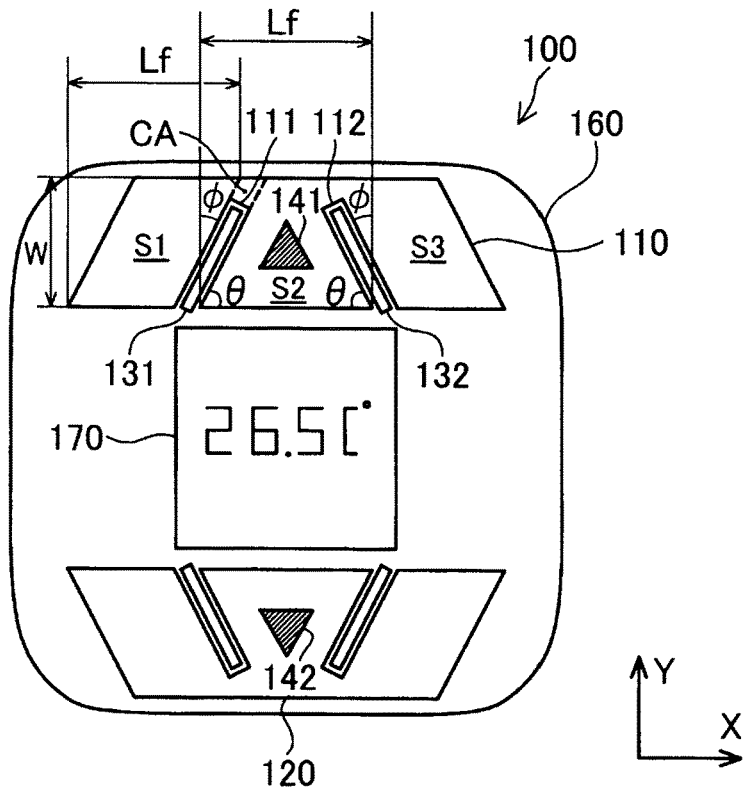
FIG. 14 is a top view illustrating a touch panel according to another embodiment.

In FIG. 13, each touch electrode 110 and 120 is separated by a single slit 111 into tow touch regions S1 and S2. The touch regions S1 and S2 have shapes of approximate quarter-circles. A circumscribed rectangle which circumscribes each touch region S1 and S2 has a length Le along the longitudinal direction X and a width We along the transverse direction Y. A ratio (Le/We) of the length Le to the width We is approximately 1.3. In FIG. 14, each slit 111 and 112 of the touch electrodes 110 and 120 is angled by θ (first angle) with respect to the longitudinal direction X. The angle θ is larger than 45° and smaller than 90° (45°<θ<90°). Each slit 111 and 112 of the touch electrodes 110 and 120 is angled by φ (second angle) with respect to the transverse direction Y. The angle φ is larger than 0° and smaller than or equal to 45° (0°<φ≤45°). That is, the angle θ is larger than the angle φ. Therefore, the slits 111 and 112 extend in directions which are angled at θ with respect to the longitudinal direction X and angled at φ with respect to the transverse direction Y. In other words, the slits 111 and 112 of FIG. 14 extend in directions which are close to the transverse direction Y than to the longitudinal direction X of the touch electrode 110. This is common to the slits 111 and 112 of FIGS. 2, 9 to 13. According to these explanations, "the slits 111 and 112 of FIG. 14 extend in directions which are close to the transverse direction Y than to the longitudinal direction X of the touch electrode 110" means that the angle θ between each slit 111 and 112 and the longitudinal direction X meets 45°<θ≤90°, or that the angle φ between each slit 111 and 112 and the transverse direction Y meets 0°≤φ≤45°. For example, when the angle θ is from 80° to 90°, the angle φ may be 0° to 10°. Further, in FIG. 14, a circumscribed rectangle which circumscribes each touch region S1, S2 and S3 has a length Lf along the longitudinal direction X and a width W along the transverse direction Y. A ratio (Lf/W) of the length Lf to the width W is approximately 1.3. Also in the case of the slits 111 and 112 shown in FIG. 14, a size of each slit 111 and 112 measured along the transverse direction Y of the touch electrode 110 may be set to be more than or equal to 80% and less than 100% of the width W of the touch electrode 110 in the transverse direction Y.

In FIGS. 9 to 14, the circumscribed rectangle which defines each touch region S1, S2 and S3 has four sides contacting each touch region S1, S2 and S3. The circumscribed rectangle is defined as a smallest rectangle having sides parallel to the longitudinal direction X of the touch electrode 110 and sides parallel to the transverse direction Y of the touch electrode 110. A ratio of the length of the circumscribed rectangle along the longitudinal direction X to the width of the circumscribed rectangle along the transverse direction Y may be more than or equal to 0.7 and less than or equal to 1.3.

In these embodiments, the touch electrode 110 is separated by the slits 111 and 112 and the guard electrodes 131 and 132 into the touch regions S1, S2 and S3. Therefore, the response of the touch electrode 110 in transition from the touched state to the non-touched state during the touch operation can be accelerated.

The present disclosure is not limited to the above-described embodiments and can be achieved by various configurations without departing from the scope. For example, the technical features described in those embodiments can be replaced or combined arbitrarily in order to solve a part or all of the above-described difficulties or to exert a part or all of the above-described effects. Further, the technical features can be omitted arbitrarily unless the features are described as essential.

While the present disclosure has been described with reference to various exemplary embodiments thereof, it is to be understood that the disclosure is not limited to the disclosed embodiments and constructions. To the contrary, the disclosure is intended to cover various modifications and equivalent arrangements. In addition, while the various elements of the disclosure are shown in various combinations and configurations, which are exemplary, other various combinations and configurations, including more, less or only a single element, are also within the spirit of the disclosure.

What is claimed is:

1. A capacitance touch switch comprising:
    a touch electrode being flat and having a first length along a first direction and a second length along a second direction, the first length being longer than the second length, the first direction being perpendicular to the second direction;
    a touch detection circuit configured to determine whether a touch operation is performed to the touch electrode based on a change in capacitance of the touch electrode; and
    a guard electrode insulated from the touch electrode, wherein
    the touch electrode includes at least one slit extending in a direction which is angled at a first angle with respect to the first direction and angled at a second angle with respect to the second direction, the first angle being larger than the second angle,
    the touch electrode is partially separated by the at least one slit into a plurality of touch regions while the plurality of touch regions being connected to each other, and
    the guard electrode is disposed within the slit.

2. The capacitance touch switch according to claim 1, wherein
    the guard electrode is connected to a ground electrode or to a ground pattern formed on a substrate on which the touch electrode is disposed.

3. The capacitance touch switch according to claim 1, wherein
    each of rectangles circumscribing the plurality of touch regions has a first length along the first direction and a second length along the second direction, and
    a ratio of the first length of the rectangle to the second length of the rectangle is from 0.7 to 1.3.

4. The capacitance touch switch according to claim 1, wherein
    the at least one slit is more than two slits arranged in the first direction such that the plurality of touch regions are arranged in the first direction.

5. The capacitance touch switch according to claim 1, wherein
    the first angle is from 80° to 90°, and
    the second angle is 0° to 10°.

6. The capacitance touch switch according to claim 1, wherein
    a ratio of the first length of the touch electrode to the second length of the touch electrode is more than 3.0.

* * * * *